(12) United States Patent
Franiatte et al.

(10) Patent No.: US 12,431,454 B2
(45) Date of Patent: Sep. 30, 2025

(54) METHOD FOR THE LOCALIZED DEPOSITION OF A MATERIAL ON A METAL ELEMENT

(71) Applicant: COMMISSARIAT A L'ENERGIE ATOMIQUE ET AUX ENERGIES ALTERNATIVES, Paris (FR)

(72) Inventors: Remi Franiatte, Grenoble (FR); Jean Charbonnier, Grenoble (FR); Nadine David, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 594 days.

(21) Appl. No.: 17/781,264

(22) PCT Filed: Nov. 30, 2020

(86) PCT No.: PCT/FR2020/052218
§ 371 (c)(1),
(2) Date: May 31, 2022

(87) PCT Pub. No.: WO2021/111067
PCT Pub. Date: Jun. 10, 2021

(65) Prior Publication Data
US 2022/0415840 A1    Dec. 29, 2022

(30) Foreign Application Priority Data

Dec. 2, 2019  (FR) ...................................... 1913629

(51) Int. Cl.
*H01L 23/00* (2006.01)
(52) U.S. Cl.
CPC .............. *H01L 24/27* (2013.01); *H01L 24/29* (2013.01); *H01L 2224/04026* (2013.01);
(Continued)

(58) Field of Classification Search
CPC ........... H01L 2224/11003; H01L 24/11; H01L 24/03; H01L 2224/1111; H01L 24/27;
(Continued)

(56) References Cited

U.S. PATENT DOCUMENTS

| 5,956,606 A | 9/1999 | Burnette |
| 6,008,071 A | 12/1999 | Karasawa et al. |

(Continued)

FOREIGN PATENT DOCUMENTS

FR    2 846 906 A1    5/2004

OTHER PUBLICATIONS

International Search Report issued on Mar. 9, 2021 in PCT/FR2020/052218 filed Nov. 30, 2020, therein, 2 pages.
(Continued)

*Primary Examiner* — Julio J Maldonado
*Assistant Examiner* — Stanetta D Isaac
(74) *Attorney, Agent, or Firm* — Oblon, McClelland, Maier &Neustadt, L.L.P.

(57) ABSTRACT

A method is provided for localised deposition of a material over an element, including deposition of a portion of the material over a portion of a surface of a support; positioning of a portion of the element against the portion of the material; annealing of the material portion increasing, at the end of the treatment, the adhesion force of the material against the portion of the element, the materials of the portion of the element and of the portion of the surface of the support being selected such that the adhesion of the material against the portion of the element is, at the end of the annealing, higher than that of the material against the portion of the surface of the support; and separation of the element and the support at the interface between the material and the portion of the surface of the support, the material remaining secured to the portion of the element.

11 Claims, 5 Drawing Sheets

(52) U.S. Cl.
CPC .............. *H01L 2224/05624* (2013.01); *H01L 2224/05647* (2013.01); *H01L 2224/1144* (2013.01)

(58) Field of Classification Search
CPC ......... H01L 24/29; H01L 24/05; H01L 24/13; H01L 24/95; H01L 2224/04026; H01L 2224/05624; H01L 2224/05647; H01L 2224/1144; H01L 2224/0401; H01L 2224/111; H01L 2224/1141; H01L 2224/11515; H01L 2224/131; H01L 2224/13109; H01L 2224/13111; H01L 2224/13139; H01L 2224/1319; H01L 2224/27003; H01L 2224/271; H01L 2224/2741; H01L 2224/2744; H01L 2224/27515; H01L 2224/29011; H01L 2224/29013; H01L 2224/291; H01L 2224/29109; H01L 2224/29111; H01L 2224/29139; H01L 2224/2919; H01L 2224/95; H01L 2924/1461; H01L 2924/00014; H01L 2924/014; H01L 2924/01029; H01L 2924/01013; H01L 2924/00012; H01L 2924/0665; B81C 2203/032; B81C 2203/035; B81C 1/00373; B81B 2201/058; B23K 1/0016; H05K 3/3478
See application file for complete search history.

(56) References Cited

U.S. PATENT DOCUMENTS

| | | |
|---|---|---|
| 6,136,047 A | 10/2000 | Karasawa et al. |
| 2005/0062157 A1 | 3/2005 | Karasawa et al. |
| 2013/0196504 A1 | 8/2013 | Ogashiwa et al. |
| 2015/0325507 A1 | 11/2015 | Uzoh et al. |
| 2018/0019191 A1 | 1/2018 | Uzoh et al. |

OTHER PUBLICATIONS

French Preliminary Search Report (with English translation of Categories of Cited Documents) issued on Aug. 14, 2020 in French Application 1913629 filed on Dec. 2, 2019, therein, 2 pages.

METHOD FOR THE LOCALIZED DEPOSITION OF A MATERIAL ON A METAL ELEMENT

TECHNICAL FIELD

This document relates to a method for the localised deposition of at least one material over at least one element, applied in particular for:
- making electrical and/or mechanical interconnections, for example fusible ball or microball type metallizations, or solder balls or microballs, on at least one electronic chip,
- making at least one sealing bead on at least one protective layer or a cap intended to close at least one cavity in which there is for example at least one component of the MEMS type ("MicroElectroMechanical System"),
- making at least one functionalisation layer for at least one sensor or a test device used in the field of biology and/or chemistry.

PRIOR ART

Commercialised electronic chips, such as ASICs or "Application-Specific Integrated Circuit", memory chips, etc., are generally intended to be connected by "wire-bonding", and are not provided with fusible-ball type metallisations, or "solder bumps", on their connection pads. Due to their small lateral dimensions (generally a few millimetres) and/or their small thickness (generally a few tens of microns), it is very difficult to manufacture fusible-ball type metallisations on each electronic chip considered individually. Such metallisation allows securing the electronic chip by "flip-chip", or flip-over, on an interposition element, or "interposer", or a substrate to which the electronic chip is intended to be mechanically and/or electrically coupled.

To form fusible-ball type metallisations on an electronic chip, these are generally formed together for several electronic chips simultaneously, at the scale of a wafer or substrate including the electronic chips. Screen-printing is the most common technique used to form fuse balls, since it is the least expensive technique for processing chips at the wafer scale.

An example of a method for the collective making of fusible-ball type metallisations by screen-printing is described hereinbelow with reference to FIGS. 1 to 4.

As shown in FIG. 1, solder paste 10 including a fusible material, or a metallic solder material, is spread over a substrate 12 in which or on which the chips have been made beforehand, on the side where the fusible balls are intended to be formed. The solder paste 10 is spread for example by a scraper 11 through a screen-printing screen 14 or screen-printing mask. Openings formed through the screen-printing screen 14 define locations of the substrate 12 over which the solder paste 10 is deposited in the form of small portions 15 spaced apart from each other.

Afterwards, the screen-printing screen 14 is removed and then annealing is implemented at a temperature higher than or equal to the melting temperature of the fusible material so that the portions 15 switch into the liquid state then form, upon completion of this annealing and after return of the fusible material into the solid state, balls 16 of the fusible material (FIG. 2).

Afterwards, a cutting of the substrate 12 is implemented in order to form electronic chips 18 separated from each other and each provided with fusible balls 16 (FIG. 3).

In FIG. 4, an electronic chip 18 ready to be affixed by "flip-chip" onto a support is shown.

This making of the fusible balls 16 by depositing the fusible material by screen-printing cannot be considered for individual chips, i.e. at the scale of an already cut electronic chip over which the screen-printing screen would be disposed, because it would significantly increase the manufacturing cost of electronic chips.

In addition, this method for forming fusible balls is not suitable when the surface on which the fusible balls are to be formed is irregular and includes recesses because when the paste 10 is spread, it is not properly deposited in the recesses. In addition, because the screen-printing screen 14 should be pressed against the surface on which the fusible balls are formed during the deposition of the paste 10, the irregularities of this surface pose a flatness problem.

Similar constraints also exist in other applications, such as, for example, when forming sealing beads intended to secure caps or protective layers for MEMS devices, or else when making functionalisation layers for sensors and test devices used in the field of biology and/or chemistry.

DISCLOSURE OF THE INVENTION

The present invention aims to provide a method for the localised deposition of at least one material over at least one element which does not have the drawbacks of the previously-described prior art, i.e. which allows depositing the material locally over an individual element with small dimensions such as an electronic chip, and/or depositing the material over an irregular surface featuring recesses.

For this purpose, a method for localised deposition of at least one material over at least one element is provided, comprising the implementation of the following steps:
- deposition of at least one portion of the material over at least one portion of a surface of a support;
- positioning of at least one portion of the element against the portion of the material;
- heat and/or chemical treatment of the material portion increasing, at the end of the heat and/or chemical treatment, the adhesion force of the material against the portion of the element, the materials of the portion of the element and of the portion of the surface of the support being selected such that the adhesion of the material against the portion of the element is, at the end of the heat and/or chemical treatment, higher than that of the material against the portion of the surface of the support;
- separation of the element and the support at the interface between the material and the portion of the surface of the support, the material remaining secured to the portion of the element.

In this method, the material to be deposited locally is first deposited over a support which does not correspond to the element over which the material is intended to be deposited and which serves as a temporary support. Afterwards, the portion of the element over which the material is intended to be deposited is positioned in contact with the material. Afterwards, a heat and/or chemical treatment is implemented in order to increase the adhesive force of the material against the portion of the element. At the end of the heat and/or chemical treatment, the adhesion of the material against the portion of the element is higher than that of the material against the portion of the surface of the support. This property is obtained by properly selecting the materials forming the portion of the surface of the support and the portion of the element against which the material is disposed. Thus, the separation which is carried out afterwards between the element and the support causes a rupture at the interface between the material and the portion of the surface of the support, with the material which remains secured to the element. Hence, the material is actually deposited locally over the element.

This method is particularly well suited to be implemented with small-sized individual elements, for example electronic chips, which are independent of one another. This method could be implemented simultaneously for several individual elements. This method is also well suited to locally deposit a material over elements having irregular material receiving surfaces comprising recesses since no screen-printing is directly implemented on these receiving surfaces.

This method could be implemented for many applications: making of fusible-ball type metallisations on one or several individual electronic chip(s), making of sealing beads intended to secure caps or protective layers for MEMS devices, making of electrical and/or mechanical interconnections, making of functionalisation layers for sensors and test devices used in the field of biology and/or chemistry.

Throughout the document, the term "ball" is used to designate microballs with micrometric dimensions, or balls with larger dimensions.

The heat and/or chemical treatment may correspond to at least one of the following treatments: annealing at a temperature higher than or equal to the melting temperature of the material, dehydration, quenching, freezing, polymerisation.

The deposition of the portion of the material over the portion of the surface of the support may be carried out by screen-printing through a screen including at least one opening determining, upon positioning the screen on the surface of the support, the location of the portion of the surface of the support.

The portion of the element may form a recess with respect to the rest of a surface of the element at which said portion of the element is located.

The portion of the surface of the support may include a marking in relief. Thus, when detaching the deposited material and the portion of the surface of the support, a pattern opposite to that of the marking is imparted onto the surface of the material that is detached off the support. This marking could be used to form logos or punches allowing identifying or authenticating the element.

The method may be such that:
the heat and/or chemical treatment corresponds to a heat treatment implemented at a temperature higher than or equal to the melting temperature of the material;
the portion of the surface of the support is such that a contact angle between the material in the liquid state and the portion of the surface of the support has a value $\theta_{C1}$;
the portion of the element is such that a contact angle between the material in the liquid state and the portion of the element has a value $\theta_{C2} < \theta_{C1}$.

In this case, upon the heat treatment, the treated material changes phase and switches into the liquid state. These values of the contact angles $\theta_{C1}$ and $\theta_{C2}$ are obtained by properly selecting the materials forming the portion of the surface of the support and the portion of the element and which are in contact with the material in the liquid state. With such contact angles, after the material has returned into the solid state, the adhesion of the material against the portion of the element is much higher than that of the material against the portion of the surface of the support.

In an advantageous configuration, the method may be such that:
the material is a metallic solder material, and
the implemented heat treatment is annealing.

In addition, the metallic solder material may include at least one of the following metals: tin, indium, silver, and the portion of the surface of the support may include a metal oxide and the portion of the element may include at least one of the following metals: aluminium, copper, gold. Such materials allow obtaining, on the side of the element, a material said "wettable" by the metallic solder material and, on the support side, a material said "non-wettable" by the metallic solder material.

The method may further include, between the deposition of the portion of the material over the portion of the surface of the support and the positioning of the portion of the element against the portion of the material, the implementation of an initial annealing of the material portion. This initial annealing allows removing part of the solvents present in the material deposited over the portion of the surface of the support.

According to a first embodiment, the element may correspond to an electronic chip.

In addition, the method may be such that:
several material portions are deposited over the support,
the portions of the electronic chip disposed against the material portions correspond to electrical contact pads, and
after the implementation of the heat treatment, the material portions form of fusible-ball type metallisations.

According to a second embodiment, the method may be such that:
the element corresponds to a protective layer or a cap adapted to enclose or protect at least one MEMS-type device in a cavity, and
after the implementation of the heat treatment, the material portion forms a sealing bead secured to the protective layer or to the cap.

Throughout this document, the expression "MEMS device" is used to refer to MEMS or NEMS ("NanoElectroMechanical System") or MOEMS ("Micro-Opto-Electro-Mechanical System") or NOEMS ("Nano-Opto-ElectroMechanical System") devices or any other electronic or microelectronic device intended to be enclosed or protected within a cavity.

The method may be such that:
the material is an organic material, and
the heat and/or chemical treatment comprises the implementation of dehydration and/or a heat treatment of the quenching type and/or freezing.

In this case, the element may correspond to a test device or a sensor intended for biological and/or chemical applications, and the material portion forms, at the end of the heat and/or chemical treatment, a functionalisation layer.

The method may be such that:
the material is a polymer, and
the heat and/or chemical treatment corresponds to a polymerisation comprising the implementation of an illumination by a laser beam and/or an insolation by UV or infrared radiation of the material.

In general, the method may be implemented simultaneously for several elements.

In addition, the elements may have different thicknesses.

BRIEF DESCRIPTION OF THE DRAWINGS

The present invention will be better understood upon reading the description of embodiments given merely for informative and non-limiting purposes with reference to the appended drawings wherein.

Identical, similar or equivalent portions of the different figures described hereinafter bear the same reference numerals so as to facilitate passage from one figure to another.

The different portions shown in the figures are not necessarily to a uniform scale, to make the figures more readable.

The different possibilities (variants and embodiments) should not be understood to be exclusive of each other and could be combined with each other.

DETAILED DISCLOSURE OF PARTICULAR EMBODIMENTS

A method for localised deposition of at least one material over at least one element according to a first embodiment is described hereinbelow with reference to FIGS. 5 to 10. In this first particular embodiment, this deposition process is implemented to make fusible-ball type metallisations on electronic chips.

Figure 1:
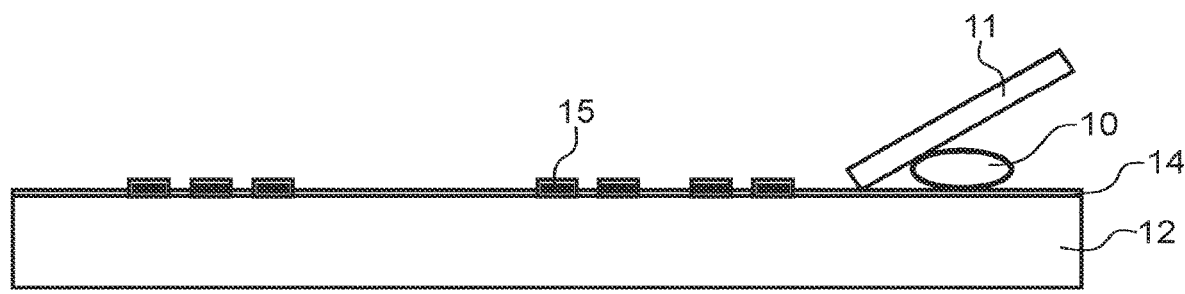
FIGS. 1 to 4 show an example of a method for forming fusible-ball type metallisations according to the prior art.
Figure 2:
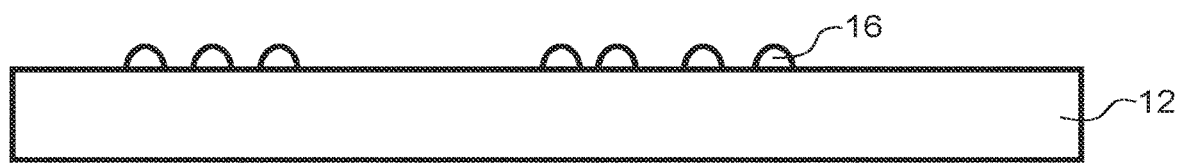
Figure 3:
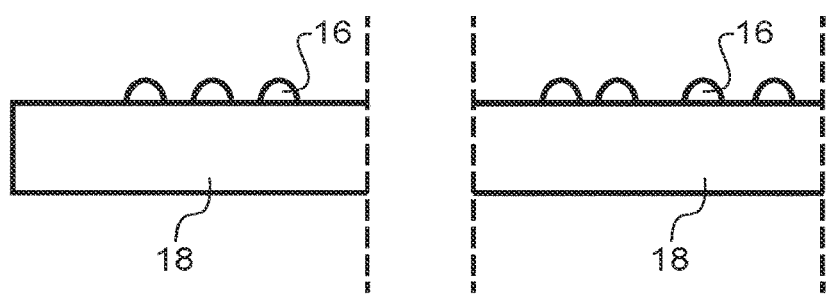
Figure 4:
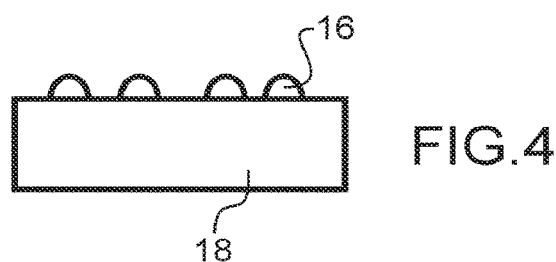
Figure 5:
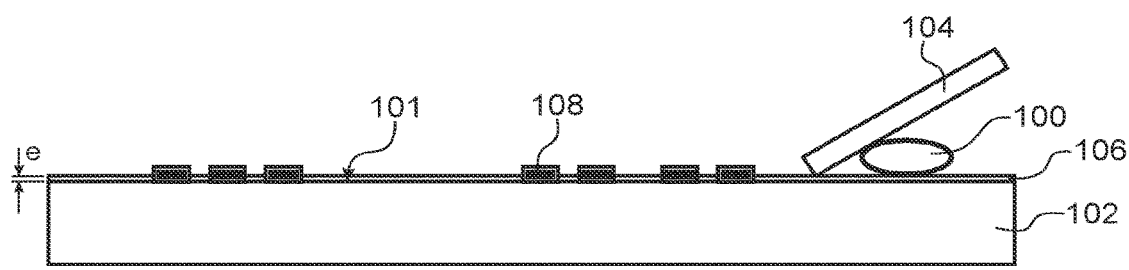
FIGS. 5 to 10 show an example of a method for localised deposition of at least one material over at least one element according to a first embodiment.
Figure 6:
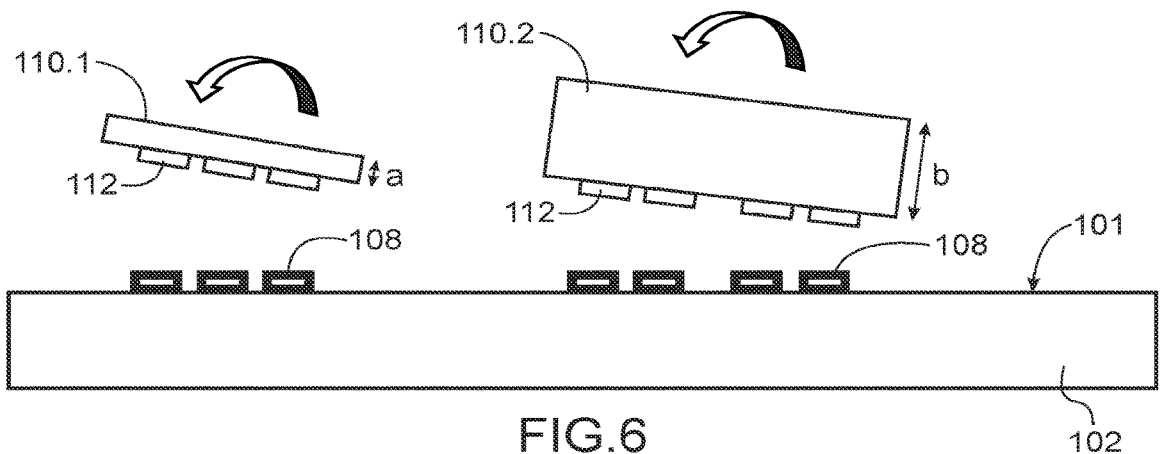
Figure 7:
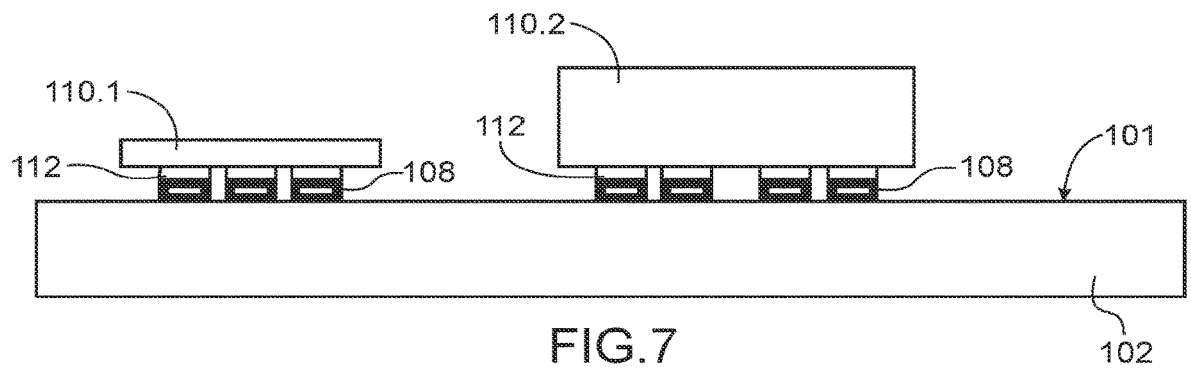

As shown in FIG. 5, solder paste 100 including a material to be deposited locally, herein a fusible material, or a metallic solder material, is spread over at least one portion of a surface 101 of a support 102. For example, the material to be deposited corresponds to tin or indium or silver or an alloy including at least one of these metals. For example, the support 102 corresponds to a semiconductor substrate, or any other support adapted to receive the deposit of the material 100.

For example, the solder paste 100 is spread with a scrape 104 through a screen-printing screen 106. Openings formed through the screen-printing screen 106 determine, upon positioning the screen-printing screen 106 on the surface 101 of the support 102, the location of the portions of the surface 101 of the support 102 over which solder paste 100 is deposited. The reference 108 designates the material portions deposited over the support 102. The thickness "e" of the mask 106, which corresponds to the thickness of the deposited material portions 108, is for example between about 40 μm and 500 μm.

The portions of the surface 101 of the support 102 over which the material portions 108 are deposited comprise a material such that when the material of the portions 108 is in the liquid state, the contact angle between the material in the liquid state and the portions of the surface 101 of the support 102 over which the portions 108 are deposited has a value $\theta_{C1}$. It is possible that the entire surface 101 of the support 102 at which the material is deposited, i.e. the entire face of the support 102 on the side of which the material is deposited, includes such a material.

This material of the portions of the surface 101 of the support 102 over which the portions 108 are deposited is selected such that it is less "wetting", or includes a lower wettability, than that of the element(s) (corresponding to electronic chips in the first embodiment described herein) to which the portions 108 are intended to be deposited locally at the end of the method. Thus, the material of said portion(s) of the surface 101 of the support 102 may be such that a contact angle between the material of the portions 108 in the liquid state and said portion(s) of the surface 101 of the support 102 has a value $\theta_{C1}$, and the material of the portion(s) of the elements to which the portions 108 are intended to be deposited locally upon completion of the method may be such that a contact angle between the material of the portions 108 in the liquid state and said portion(s) of these elements has a value $\theta_{C2} < \theta_{C1}$.

In the case where the deposited material corresponds to one of the aforementioned solder materials, the material of the portion(s) of the surface 101 of the support 102 may correspond to a metal oxide such as copper oxide. For example, in the embodiment described herein, the surface 101 of the support 102 is formed by a metal oxide layer. In the case where the metallic material corresponds to a metal oxide, its wettability could be adjusted via the parameters of implementation of the oxidation forming this material, for example by adjusting the parboiling duration or the plasma treatment of this oxidation.

Optionally, an initial annealing of the material portions 108 at a temperature making the material 100 switch into the liquid state, i.e. at a temperature higher than or equal to the melting temperature of the material of the portions 108, is implemented. This initial annealing allows removing part of the solvents present in the deposited material, and is implemented for example at a temperature between about 220° C. and 260° C. when the deposited material corresponds to one of the aforementioned solder materials, and for a period between about 5 and 15 minutes.

Afterwards, the screen 106 is removed and one or several element(s) 110 are disposed against the portions 108. In the first embodiment described herein, several elements referenced 110.1 and 110.2, corresponding to electronic chips, are disposed against the portions 108 (cf. FIGS. 6 and 7).

Each of the chips 110.1 and 110.2 includes, on one of their faces, connection pads 112 forming the portions against which the fusible-ball type metallisations are intended to be formed. These connection pads 112 include a material such that when the fusible material is in the liquid state, the contact angle between the fusible material in the liquid state and the connection pads 112 has a value $\theta_{C2} < \theta_{C1}$. In the case where the material 100 corresponds to one of the aforementioned solder materials, such a material may correspond to aluminium, copper or gold or an alloy including at least one of these metals. Furthermore, the connection pads 112 present on the electronic chips 110.1 and 110.2 are disposed according to an arrangement compatible with that of the portions 108, i.e. such that when the electronic chips 110.1 and 110.2 are placed against the portions 108, these portions 108 lie in contact with the connection pads 112.

Figure 8:
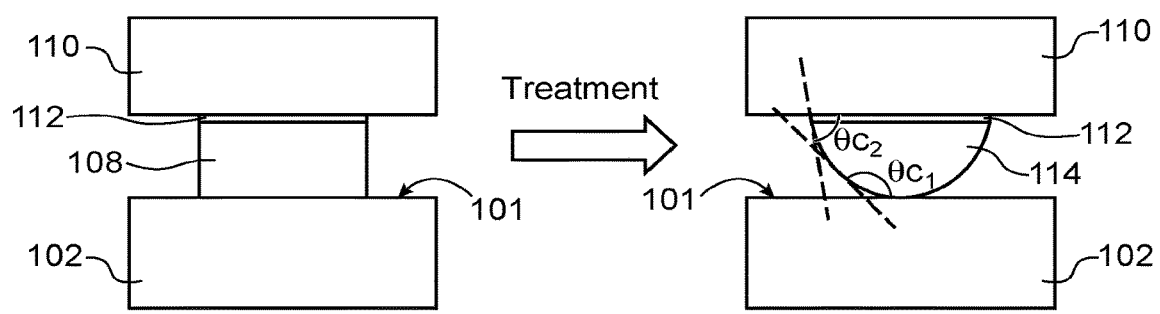

Afterwards, as shown in FIG. 8, a heat and/or chemical treatment of the material portions 108 is implemented in order to cause at the end of this treatment, an increase in the adhesion of the material against the connection pads 112. In the first embodiment described herein, this treatment corresponds to a heat treatment, and more particularly an annealing implemented in a passing furnace at a temperature higher than or equal to the melting temperature of the material of the portions 108. This heat treatment is implemented, for example, at a temperature between about 220° C. and 260° C. when the material of the portions 108 corresponds to one of the aforementioned solder materials, and for a duration between about 5 min. and 15 min (complete duration including the temperature rise and fall). During this heat treatment, the portions 108 could be exposed to a temperature between about 220° C. and 260° C. for a period in the range of one minute. The material portions obtained at the end of the annealing, after the solidification of the deposited material, bear the reference 114.

The materials of the portion(s) of the element(s) over which the material is intended to be deposited locally, i.e. the material of the connection pads 112 in the embodiment described with reference to FIGS. 5 to 10, and of the portion(s) of the surface 101 of the support 102 over which the material is initially deposited are selected such that during the implemented annealing, the contact angles $\theta_{C1}$ and $\theta_{C2}$ are such that $\theta_{C2} < \theta_{C1}$. These contact angles are shown in FIG. 8. With such contact angles, at the end of the annealing, the adhesion of the material of the portions 114 against the connection pads 112 is higher than that of the material of the portions 114 against the portions of the surface 101 of the support 102 in particular because of the largest contact surface obtained between the material of the portions 114 and the connection pads 112 in comparison with that between the material of the portions 114 and the surface 101 of the support 102.

For example, when the material to be deposited corresponds to a solder comprising a tin alloy (tin composition higher than 96%), the material of the portion(s) of the surface 101 of the support 102 over which the material is initially deposited may be selected such that the adhesion between the material of the portions 114 and the portions of the surface 101 of the support 102 is lower than about 3 kg/mm$^2$ when this value is measured in a shear test, after the implementation of the annealing, according to the methodology described in the following publications: "Effect of intermetallic compound thickness on shear strength of 25 μm diameter Cu-pillars" by Julien Bertheau et al., Intermetallics, vol. 51, August 2014, pages 37-47, and "Effects of bump size on deformation and fracture behaviour of Sn3.0Ag0.5Cu/Cu solder joints during shear testing" by Yanhong Tian et al., Materials Science and Engineering: A, vol. 529, Nov. 25, 2011, pages 468-478.

In the first embodiment described herein, the obtained portions 114 correspond to fusible-ball type metallisations. For example, the diameter of these balls is between about 40 μm and 500 μm.

Figure 9:
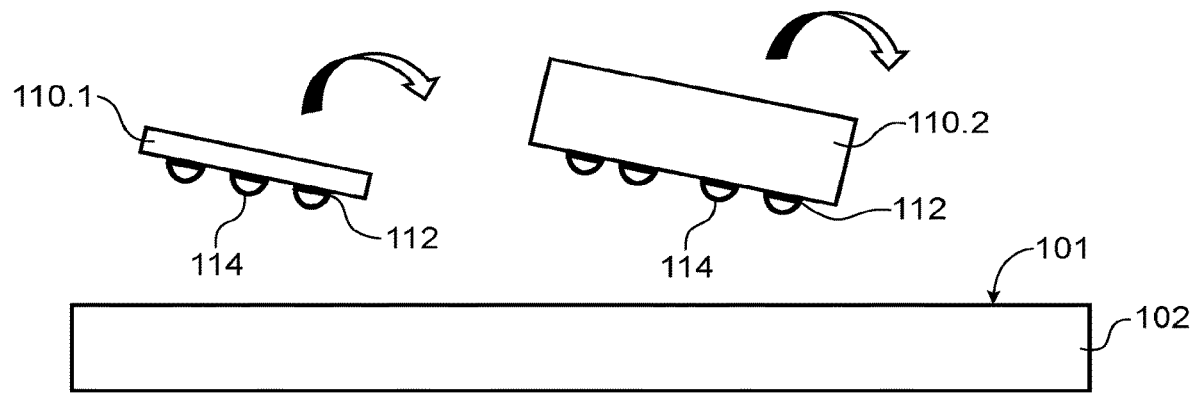

As shown in FIG. 9, the electronic chips 110.1 and 110.2 are removed and separated from the support 102, advantageously together. Since the adhesion of the portions 114 against the connection pads 112 is higher than that of the portions 114 against the support 102, the portions 114 remain secured to the electronic chips 110.1 and 110.2 and are detached from the support 102.

Figure 10:
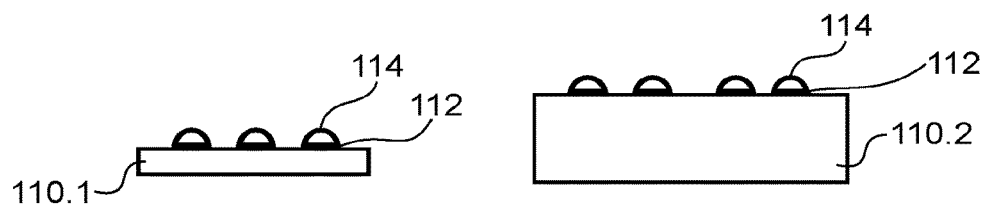

The obtained electronic chips 110.1 and 110.2 shown in FIG. 10 are ready to be affixed by "flip-chip" on another support.

Advantageously, the portions of the support 102 over which the portions 108 are deposited include a marking in relief. Thus, upon detaching the portions 114 and the support 102, this marking lies (in an inverted pattern) over the surface of the material of the portions 114 that has been in contact with the support 102. For example, this marking could be used to form logos or punches allowing identifying or authenticating the element(s) 110.

Advantageously, the above-described method applies for a localised deposition of the material 100 over one or several portion(s) of one or several element(s) 110, corresponding for example to electronic chips, forming one or several recess(es) with respect to the rest of the surface of the element(s) 100 at which this or these portion(s) are located. Since the screen-printing of the material to be deposited is not carried out directly over this irregular surface and that the material is "transferred" from the support 102 to the element(s) 110 through the implementation of the heat and/or chemical treatment, this transfer is done without any difficulty on this irregular surface.

The previously-described localised deposition process could be implemented for applications other than making of fusible-ball type metallisations.

A method for localised deposition of at least one material over at least one element according to a second embodiment is described hereinbelow with reference to FIGS. 11 to 15. In this second embodiment, this deposition method is implemented to form a sealing bead of a cap or a protective layer of a MEMS-type device.

Figure 11:
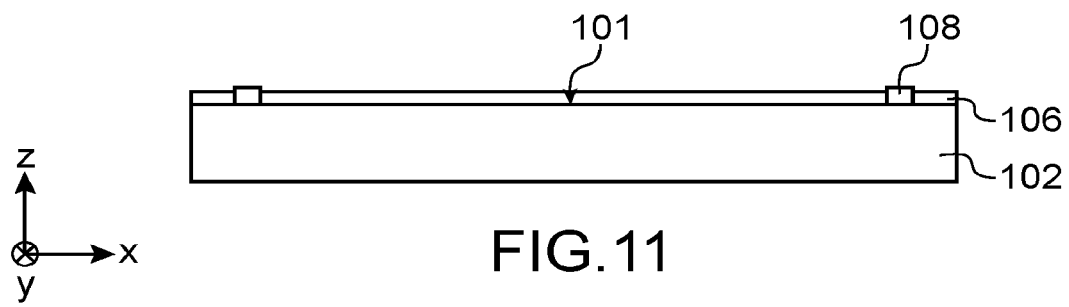
FIGS. 11 to 15 show an example of a method for localised deposition of at least one material over at least one element according to a second embodiment.
Figure 12:
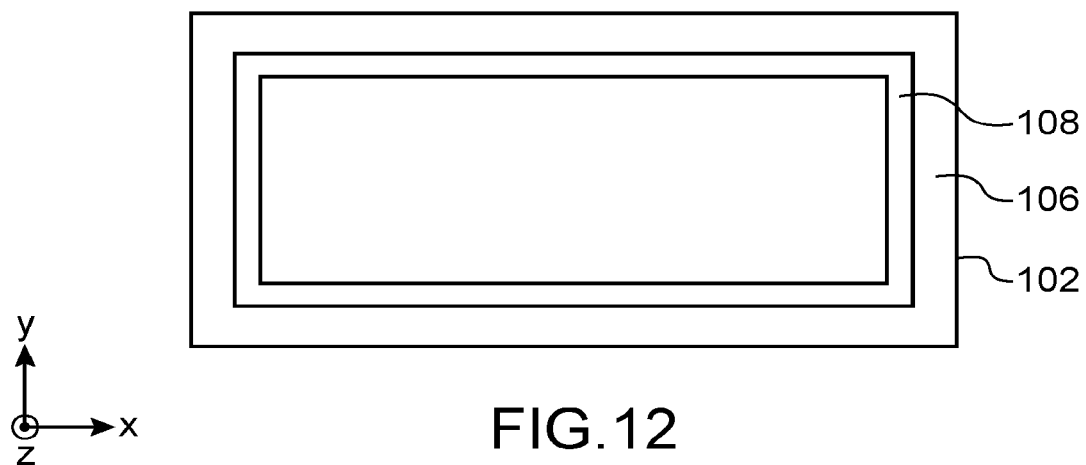

In FIGS. 11 and 12, like in the first embodiment, the material is deposited by screen-printing over the support 102. In this second embodiment, the material 100 is deposited in the form of a portion 108 including for example a pattern with a closed contour and intended to form a sealing bead. The material 100 herein corresponds to a fusible material for example similar to that described before for the first embodiment. In addition, at least the portion(s) of the surface 101 of the support 102 (possibly the entire surface 101 of the support 102) over which the material of the portion 108 is deposited comprises a so-called "non-wettable" material, corresponding for example to one of the examples of materials described before for the first embodiment.

As in the first embodiment, optionally, an initial annealing may be implemented at a temperature higher than or equal to the melting temperature of the material 100 in order to remove the solvents present in the deposited material.

Figure 13:
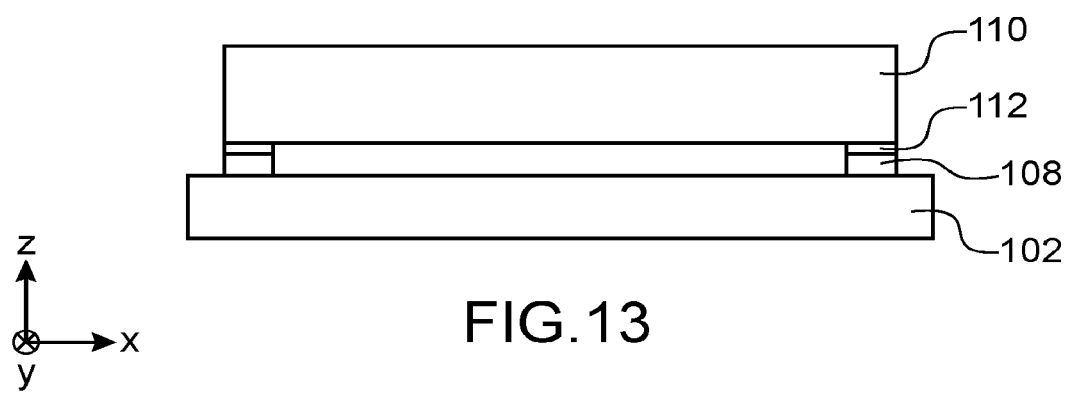

The screen 106 is removed and an element 110 corresponding to a protective layer or a cap is positioned against the portion 108 (FIG. 13). Like for the electronic chips previously described in the first embodiment, the element 110 forming the cap or the protective layer includes, on the face intended to receive the portion 108, a "wettable" material corresponding for example to one of the examples of materials previously mentioned in the first embodiment. Hence, the element 110 may include a region 112 of a material similar to that of the contact pads 112 and whose shape and dimensions correspond to those of the sealing bead intended to be formed.

Afterwards, an annealing is implemented at a temperature higher than or equal to the melting temperature of the material of the portion 108. During this annealing, the material of the portion 108 switches into the liquid state, forming, like in the first embodiment, contact angles $\theta_{C1}$ and $\theta_{C2}$ such that $\theta_{C2} < \theta_{C1}$. The portion 114 obtained at the end of the annealing forms a sealing bead whose adhesion against the element 110 is higher than that against the support 102.

Figure 14:
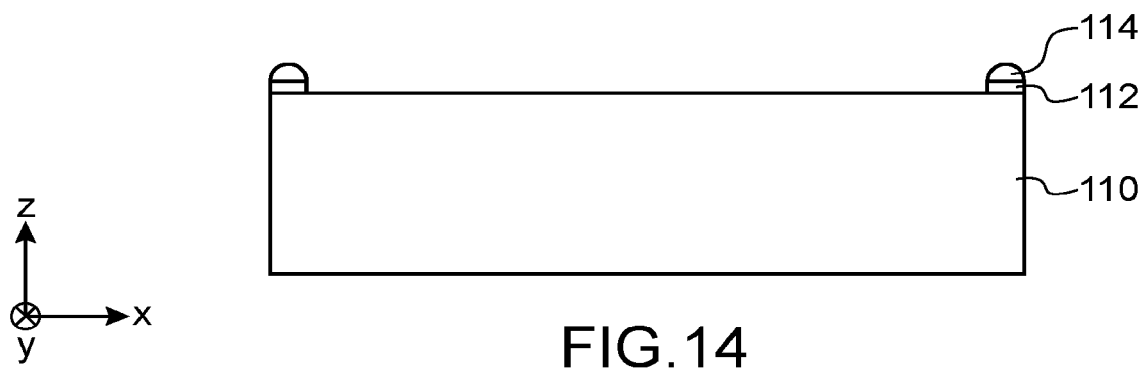
Figure 15:
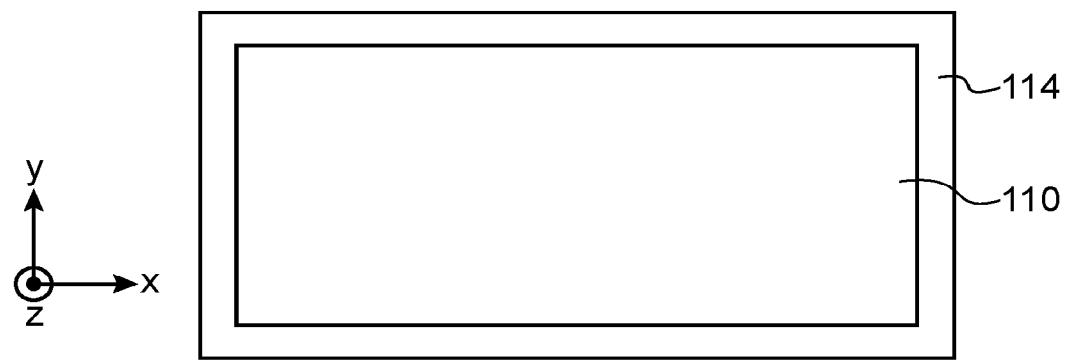

The element 110 is removed, which separates the portion 114 off the support 102 (FIGS. 14 and 15). The obtained cap 110 is ready to be affixed to close, for example, a cavity in which a MEMS device is disposed.

Like in the first embodiment, the support 102 may include a marking in relief whose pattern is then found on the surface of the material of the portion 114 that has been in contact with the support 102.

For other applications, the method could be implemented to carry out a localised deposition of at least one organic material, corresponding for example to a compound comprising organic binders. In this case, the implemented heat and/or chemical treatment corresponds to a step of drying and/or dehydrating the material. After having completed the separation between the element(s) 110 (for example chips) over which the material has been deposited locally and the support 102, the elements 110 may be subjected to a subsequent heat treatment allowing stabilising the locally deposited material and/or or obtaining the desired compound.

In this case, the method is advantageously implemented to functionalise a sensor, as described in the document "Optimisation of the screen-printing process for making thick layer gas sensors", doctoral thesis defended by Beatrice Riviere in Saint-Etienne Feb. 4, 2004, p 34, part B.1.1 "Principle of screen-printing".

For other applications, the method could be implemented to carry out a localised deposition of at least one polymer material. For example, such polymer materials correspond to epoxy-based encapsulation or coating resins, called "Glob Top", which are used in particular to protect components, for example electronic components, from the external environment. In this case, the implemented heat and/or chemical treatment corresponds to a polymerisation obtained for example by implementing UV exposure through the support 102 which should be transparent to the radiation used for the polymerisation. This polymerisation allows stiffening and setting the chemical composition of the deposited material. Afterwards, the support 102 is separated from the component(s) over which the polymerised resin has been deposited and which remains secured to the component(s). Alternatively, depending on the nature of the polymer to be deposited, the polymerisation may also be carried out by a laser beam and/or insolation by infrared radiation.

For other applications, the method could be implemented to make test devices intended for biological and/or chemical applications. For example, this method could be used to deposit locally, over elements corresponding to microfluidic chips, for example based on polydimethylsiloxane or PDMS, a material in a gel or liquid form, comprising for example proteins, to be analysed. This material could be deposited over the support 102 by screen-printing or by another method (pipette, syringe). Afterwards, one or several microfluidic chip(s) 110, including specific areas for the material in a gel or liquid form adheres after a heat and/or chemical treatment of the freezing and/or quenching type, are positioned on the support 102, in the areas where the material has been dispensed. Afterwards, the heat and/or chemical treatment is implemented, which enables the material to adhere to the chips 110. Afterwards, the support 102 is removed, and the chips 110 are recovered. Upon completion of the method, to carry out the analyses of the material deposited over the chips 110, a heat treatment is for example implemented so that the material recovers its gel or liquid state, which allows carrying out another one of the material, for example of the proteins contained in the liquid or the gel.

LIST OF CITED DOCUMENTS

Julien Bertheau et al., "Effect of intermetallic compound thickness on shear strength of 25 µm diameter Cu-pillars", Intermetallics, vol. 51, August 2014, pages 37-47.

Yanhong Tian et al., "Effects of bump size on deformation and fracture behaviour of Sn3.0Ag0.5Cu/Cu solder joints during shear testing", Materials Science and Engineering: A, vol. 529, Nov. 25, 2011, pages 468-478.

Beatrice Riviere, doctoral thesis entitled "Optimization of the screen-printing process for making thick layer gas sensors", Saint-Etienne, Feb. 4, 2004, p. 34, part B.1.1 "Principle of screen-printing".

The invention claimed is:

1. A method for localized deposition of a material over an element, the method comprising:
   depositing a portion of the material over a portion of a surface of a support;
   positioning a portion of the element against the portion of the material;
   heat corresponding to an annealing performed at a temperature higher than or equal to a melting temperature of the material, the portion of the material to increase, at an end of the heat treatment, an adhesion force of the material against the portion of the element, materials of the portion of the element and of the portion of the surface of the support being selected such that the adhesion force of the material against the portion of the element is, at the end of the heat treatment, higher than that of the material against the portion of the surface of the support; and
   separating the element and the support at an interface between the material and the portion of the surface of the support, the material remaining secured to the portion of the element, wherein:
   the portion of the surface of the support is such that a contact angle between the material in a liquid state and the portion of the surface of the support has a value $\theta_{C1}$;
   the portion of the element is such that a contact angle between the material in the liquid state and the portion of the element has a value $\theta_{C2} < \theta_{C1}$;
   the material corresponds to a metallic solder material including at least one of the following metals: tin, indium, and silver; and
   the portion of the surface of the support includes a metal oxide and the portion of the element includes at least one of the following metals: aluminium, copper, and gold.

2. The method according to claim 1, wherein the step of depositing the at least one portion of the material over the portion of the surface of the support is performed by screen-printing through a screen including at least one opening, and determining, upon positioning the screen on the surface of the support, a location of the portion of the surface of the support.

3. The method according to claim 1, wherein the portion of the element forms a recess with respect to a rest of a surface of the element at which lies said portion of the element.

4. The method according to claim 1, wherein the portion of the surface of the support includes a marking in relief.

5. The method according to claim 1, further comprising, between the step of depositing the portion of the material over the portion of the surface of the support and the positioning of the portion of the element against the portion of the material, an implementation of an initial annealing of the portion of the material.

6. The method according to claim 1, wherein the material has an adhesion to the surface of the support lower than 3 kg/mm$^2$.

7. The method according to claim 1, wherein the element corresponds to an electronic chip.

8. The method according to claim 7, wherein:
   several portions of the material are deposited over the support,
   the portions of the electronic chip disposed against the portions of the material correspond to electrical contact pads, and
   after the heat treatment, the portions of the material form of fusible-ball type metallisations.

9. The method according to claim 1, wherein:
the element corresponds to a protective layer or a cap adapted to enclose or protect at least one MEMS-type device in a cavity, and after the heat treatment, the portion of the material forms a sealing bead secured to the protective layer or to the cap.

10. The method according to claim 1, wherein the method is implemented simultaneously for several elements.

11. The method according to claim 10, wherein the elements have different thicknesses.

* * * * *